United States Patent [19]

Hwo

[11] Patent Number: 5,281,483
[45] Date of Patent: Jan. 25, 1994

[54] METALLIZED FILMS

[75] Inventor: Charles C. Hwo, Sugar Land, Tex.

[73] Assignee: Shell Oil Company, Houston, Tex.

[21] Appl. No.: 929,231

[22] Filed: Aug. 14, 1992

[51] Int. Cl.$^5$ .............................................. B32B 15/08
[52] U.S. Cl. ..................................... 428/461; 427/306
[58] Field of Search ......................... 428/461; 427/306

[56] References Cited

U.S. PATENT DOCUMENTS

| 4,564,424 | 1/1986 | Cassat et al. | 428/411.1 |
| 4,889,135 | 12/1989 | Poettgen | 428/461 |
| 4,960,820 | 10/1990 | Hwo | 524/528 |

OTHER PUBLICATIONS

Encyclopedia of Polymer Science and Engineering (2nd Ed.), vol. 9, pp. 580-622.

Primary Examiner—Paul R. Michl
Assistant Examiner—Edward Cain
Attorney, Agent, or Firm—James O. Okorafor

[57] ABSTRACT

It is herein disclosed a metallized film having an exhibiting a superior surface gloss, said film comprising a blend of (i) no more than about 10% by weight of low molecular weight, isotactic poly-1-butene with a melt flow in the range, of greater than 20 to about 1500 g/10 min., and (ii) at least about 90% by weight of a propylene polymer.

8 Claims, No Drawings

METALLIZED FILMS

Field of the Invention

This invention generally relates to metallized polymer films. More particularly, this invention relates to a metallized polymer film made from a blend comprising of polypropylene and polybutylene.

BACKGROUND OF THE INVENTION

Films of thermoplastic polymer compositions have found many commercial uses, particularly in packaging. One use of such films is in the production of shrink films and films for wrapping foods.

Blown films are popular in the commercial arena. Methods for producing blow film from commercial film grade polybutylene reins are known in the art.

The present invention relates to compositions which can be formed into films or sheets that have improved processing properties and good optics. The novel sheets can be biaxially oriented to result in films with good optics. In packaging applications, the surface appearance (gloss) of the films is important. A film with good surface gloss is more desirable than one with a poor surface gloss. Thus, in addition to having improved processing properties and optics, it is also desirable that the inventive films or sheets have improved surface gloss.

SUMMARY OF THE INVENTION

It is a general object of the present invention to provide a metallized polymer film having an improved surface gloss.

Accordingly, it is now provided a metallized polymer film having and exhibiting an improved surface gloss, wherein said film comprises a blend of (i) no more than about 10% by weight of low molecular weight, isotactic poly-1-butene (polybutylene) with a melt flow in the range of greater than 20 to about 1500 g/10 min, and (ii) at least about 90% by weight of a propylene polymer.

DETAILED DESCRIPTION OF THE INVENTION

The materials useful in the practice of this invention include polyolefin polymers which can be processed into films, metallizing equipment, and conventional additives such as antioxidants and stabilizers. Further details of these materials are herein disclosed.

All polyolefin polymers which are capable of being processed into film are suitable in the practice of this invention. These polymers include polyethylene, polybutene-1 (polybutylene), polybutene, polyketones, polyiosprene, and polymethylpentene and their copolymers. Polypropylene and polybutylene homo and copolymers are the preferred polyolefin polymers.

The useful polybutene-1 homo or copolymer can be isotactic, elastomeric, syndiotactic, or it can have any characteristic that is known or expected of polybutene-1. These polybutene-1 polymers have a melt flow in the range of from about 20 to 1500, with a preferred range of from about 50 to 1000, and a particularly preferred range of from 100 to 750 g/10 min. as measured by ASTM D1238 condition "L" at 230° C. These polybutene-1 polymers including their methods of preparation, and their properties are known in the art. An exemplary reference containing additional information on polybutylene is U.S. Pat. No. 4,960,820 which is herein incorporated by reference.

The particularly preferred polybutene-1 polymer is Duraflex ® PB DP0800. This polybutene-1 homopolymer has a melt flow of 490 g/10 min. at 230° C. and a weight average molecular weight of 108,000. Duraflex ® PB DP0800 is commercially available, and can be obtained from Shell Chemical Company of Houston, Tex.

The polypropylene used in the present invention is any crystallizable polypropylene. The polypropylene can be prepared by homopolymerizing propylene irrespective of the method used so long as a crystallizable polypropylene is formed. The preferred polypropylenes are the substantially isotactic polypropylenes prepared by the Ziegler/Natta or $MgCl_2$-supported catalyst polymerization process.

The propylene polymers usable herein can be either propylene homopolymers or copolymers. If propylene copolymers are used, they can be random or block copolymers with a comonomer content preferably 1–30 mole % of either ethylene, butene, or an alpha olefin having from 5 to 8 carbon atoms.

Propylene polymers useful in the invention preferably have a melt flow of less than 30.0, more preferably from about 1.0 to 10.0 g/10 min., as measured by ASTM D-1238, Condition "L" at 230° C. A particularly suitable propylene, has a melt flow of 2.8 g/10 min. and is available from Shell Chemical Company, of Houston, Tex. as PP5A08.

One or more additives may be added to the poly-1-butene and polypropylene blend. It is contemplated that the additive can be a filler, a mold release agent, U.V. stabilizers, thermal stabilizer, slip agent, antiblock agent, nucleating agent, pigment, antioxidants, flame retardants or combination therein. The additive(s) can be added in an amount of up to between about 0.1 to about 1% by weight, based on the total weight of the composition. The additive may be added to one or more of the principal components prior to blending those components. Alternatively, the additive may be added to the blend during the actual blending of the principal components. Additionally, additive may be added to the formulation after blending of the principal components has occurred.

The components in the novel blend can be combined in amounts of no more than about 10% by weight of the poly-1-butene polymer, with at least about 90% by weight of propylene polymer. Optionally, from 0.1 to 1% by weight of an additive or combination of additives such as those listed above can be added to the blend. A preferred blend is prepared with 5% by weight of a high melt flow polybutene-1 homopolymer (melt flow greater than 100 to 750 g/10 min.) with 95% by weight of a propylene homopolymer.

Blending of the components of the inventive formulation can occur by one of several methods such as by, tumble blending, masterbatch, or melt compounding techniques. The method of combining the ingredients of the formulation is not material except as to the ultimate commercialization of the product. For example, in some cases, it is desirable to use the least amount of energy to merge the components into an effective blend.

After blending, the compositions of this invention can be formed into sheets or articles on conventional manufacturing equipment. Sheets can be formed using conventional casting equipment, that is, the formulation can be cast, then passed through a die and then placed into a solid phase pressure forming device which produces the sheets. Films can be prepared from the sheets by stretching or orienting the sheets or alternatively, by using tubular film blown processing equipment. These processing techniques are well known in the art. Articles can be formed from the blend or the sheets using conventional molding equipment, such as by thermoforming or SPPF (solid phase pressure forming.

The films or sheets so formed can then be metallized by employing conventional methods and equipment known in the art. Such methods, exemplified by vacuum deposition of metals, and equipment used in their practice are disclosed in, for example, Encyclopedia of Polymer Science and Engineering (2 Ed), Vol. 9, pp. 580–622, to which the interested reader is referred.

Because of its improved surface gloss, the metallized films are particularly useful in packaging applications, such as, snack food, medical devices, containers for medicines, and for electronic devices and parts.

The invention is further illustrated by the following non-limiting examples.

EXAMPLES 1

A batch test was conducted using two film specimens (a) (a) unmodified biaxially oriented polypropylene film (BOPP) and polybutene-1 modified biaxially oriented polypropylene film. The size of the film specimens Was 11 by 8.5 inches (28×21.6 cm). The equipment used was a batch type of bell jar vacuum deposition chamber.

The surfaces of the treated specimen were metallized. The metallized films were then tested using a standard pressure sensitive adhesive. One cycle of experiment lasted for about 1.5 hours including 1 hour of vacuum time.

The specimens were tested for adhesion. It was observed that for both specimens, the treated surfaces showed good adhesion with aluminum. The specimens were also observed for gloss, and it was noted that the metallized surface of specimen (b), i.e. the polybutylene modified biaxially oriented polypropylene film, exhibited a significantly improved gloss than the surface of specimen (a).

EXAMPLE 2

The procedure of Example 1 was repeated except for the following modifications. A continuous vacuum metallizing unit that is capable of metallizing films of up to 21 inches (53 cm) wide with a maximum roll diameter of 11 inches (28 cm) was used. This equipment generates data which correlates with commercial metallizing equipment.

The optical density readings of the film specimens were taken using a Bramicro densitometer. The modified biaxially oriented polypropylene film had a reading of 2.45, while the unmodified biaxially oriented polypropylene film had a reading of 2.28. The adhesive behavior of the specimens were observed to be the same as in Example 1. It was also observed that the metallized surface of polybutylene modified biaxially oriented polypropylene film had and exhibited a significantly improved gloss than the surface of the unmodified film.

While this invention has been described in detail for the purpose of illustration, it is not to be construed as limited thereby but is intended to cover all changes and modifications within the spirit and scope thereof.

What is claimed is:

1. A metallized film having and exhibiting superior surface gloss, said film comprising a blend of (i) no more than about 10% by weight of low molecular weight, isotactic poly-1-butene with a melt flow in the range of greater than 20 to about 1500 g/10 min., and (ii) at least about 90% by weight of a propylene polymer.

2. A metallized film as in claim wherein metallization is accomplished by means of vacuum deposition of metals.

3. A metallized film as in claim 1, wherein said polybutylene-1 has a melt flow in the range of 50–1000 g/10 min.

4. A metallized film as in claim 1, wherein said polybutylene-1 has a melt flow in the range of 100–750 g/10 min.

5. A metallized film as in claim 1, wherein said polypropylene has a melt flow of less than 30 g/10 min.

6. A metallized film as in claim 1, wherein said polypropylene has a melt flow of from about 1.0–10.0 g/10 min.

7. A metallized film as in claim wherein said blend comprises 5 wt% of polybutylene-1 homopolymer having a melt flow of greater than 100–750 g/10 min.

8. A metallized film as in claim 1 wherein said blend further comprises from about 0.1 to 1.0 wt % of one or more additives selected from the group consisting of a filler, a mold release agent, a U.V. stabilizer, a thermal stabilizer, a slip agent, an antiblock agent, a pigment, a nucleating agent, a flame retardant, and an antioxidant.

* * * * *